US012218244B2

(12) United States Patent
Gardner et al.

(10) Patent No.: US 12,218,244 B2
(45) Date of Patent: *Feb. 4, 2025

(54) VERTICAL TRANSISTOR STRUCTURES AND METHODS UTILIZING SELECTIVE FORMATION

(71) Applicant: Tokyo Electron Limited, Tokyo (JP)

(72) Inventors: Mark I. Gardner, Albany, NY (US); H. Jim Fulford, Albany, NY (US); Partha Mukhopadhyay, Albany, NY (US)

(73) Assignee: TOKYO ELECTRON LIMITED, Tokyo (JP)

( * ) Notice: Subject to any disclaimer, the term of this patent is extended or adjusted under 35 U.S.C. 154(b) by 310 days.

This patent is subject to a terminal disclaimer.

(21) Appl. No.: 17/529,051

(22) Filed: Nov. 17, 2021

(65) Prior Publication Data

US 2023/0010879 A1  Jan. 12, 2023

Related U.S. Application Data

(60) Provisional application No. 63/219,508, filed on Jul. 8, 2021.

(51) Int. Cl.
*H01L 29/786* (2006.01)
*H01L 27/092* (2006.01)
*H01L 29/66* (2006.01)

(52) U.S. Cl.
CPC ...... *H01L 29/78642* (2013.01); *H01L 27/092* (2013.01); *H01L 29/66969* (2013.01); *H01L 29/7869* (2013.01)

(58) Field of Classification Search
CPC ................. H01L 29/78642; H01L 27/092
See application file for complete search history.

(56) References Cited

U.S. PATENT DOCUMENTS

| 9,024,376 | B2 | 5/2015 | Masuoka et al. |
| 9,406,694 | B1* | 8/2016 | Ikeno ............... H01L 21/764 |
| 9,425,324 | B2 | 8/2016 | Diaz et al. |
| 9,478,624 | B2 | 10/2016 | Colinge et al. |
| 10,217,846 | B1* | 2/2019 | Xie ............... H01L 29/165 |
| 10,297,513 | B1* | 5/2019 | Yamashita ........ H01L 29/0847 |
| 10,388,760 | B1* | 8/2019 | Frougier ........ H01L 29/0834 |
| 2012/0213009 | A1* | 8/2012 | Aritome ............ H10B 41/27 257/319 |

(Continued)

*Primary Examiner* — Vincent Wall
(74) *Attorney, Agent, or Firm* — Foley & Lardner LLP

(57) ABSTRACT

Vertical transistors and methods of manufacturing vertical transistors are disclosed. The method can include forming a stack of layers include a first layer stack of a first transistor structure including at least three layers of a conductive material separated by one or more layers of at least one dielectric material. The stack of layers can include a second layer stack of a second transistor structure including at least three layers of a conductive material separated by one or more layers of at least one dielectric material, the second layer stack associated with a second transistor structure. The first and second transistor structures are separated by one or more dielectric materials. The method can include forming a channel opening in the stack. The method includes selectively forming a first channel structure within the channel opening and selectively forming a second channel structure within the channel opening.

8 Claims, 18 Drawing Sheets

(56) References Cited

U.S. PATENT DOCUMENTS

| | | | | |
|---|---|---|---|---|
| 2017/0271331 A1* | 9/2017 | Masuoka | ............... | H01L 27/092 |
| 2019/0067280 A1* | 2/2019 | Balakrishnan | ...... | H01L 29/8083 |
| 2019/0355717 A1* | 11/2019 | Zhou | .................... | H10B 41/20 |
| 2019/0355845 A1* | 11/2019 | Zhou | .................. | H01L 27/0924 |
| 2019/0371678 A1* | 12/2019 | Song | ................... | H01L 21/31053 |
| 2020/0343241 A1* | 10/2020 | Wu | .................... | H01L 29/7827 |
| 2020/0411388 A1* | 12/2020 | Wu | ................. | H01L 21/823885 |
| 2021/0135010 A1* | 5/2021 | Yamazaki | .............. | H10B 12/30 |
| 2022/0359312 A1* | 11/2022 | Fulford | ............... | H01L 29/7827 |
| 2022/0367290 A1* | 11/2022 | Fulford | ........... | H01L 21/823487 |
| 2022/0375521 A1* | 11/2022 | Yamazaki | ............. | H10B 41/27 |
| 2023/0006068 A1* | 1/2023 | Fulford | ................ | H01L 27/092 |
| 2023/0010879 A1* | 1/2023 | Gardner | ............. | H01L 21/8256 |
| 2023/0200052 A1* | 6/2023 | Fulford | ................ | H10B 12/05 |
| | | | | 257/296 |
| 2023/0225109 A1* | 7/2023 | Fulford | ............... | H10B 12/033 |
| | | | | 257/296 |
| 2023/0245929 A1* | 8/2023 | Fulford | .......... | H01L 21/823885 |
| | | | | 257/329 |
| 2023/0261067 A1* | 8/2023 | Fulford | ............ | H01L 29/42376 |
| | | | | 257/192 |
| 2023/0335555 A1* | 10/2023 | Gardner | ............. | H01L 27/0922 |

\* cited by examiner

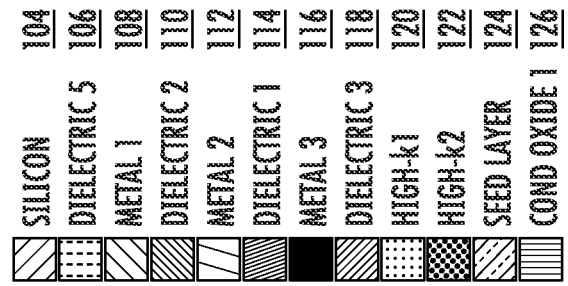
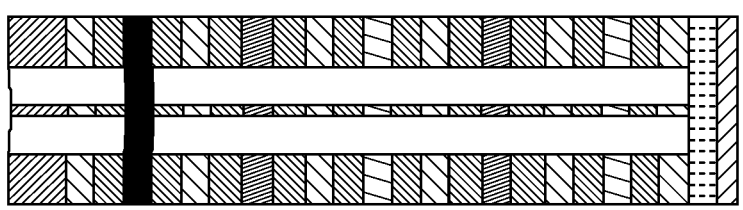
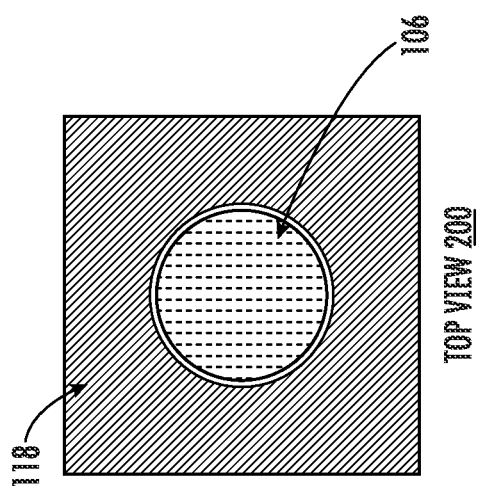
FIG. 2

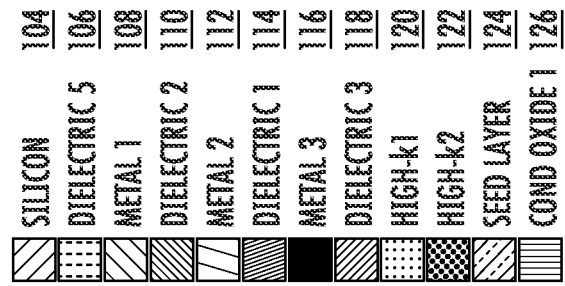
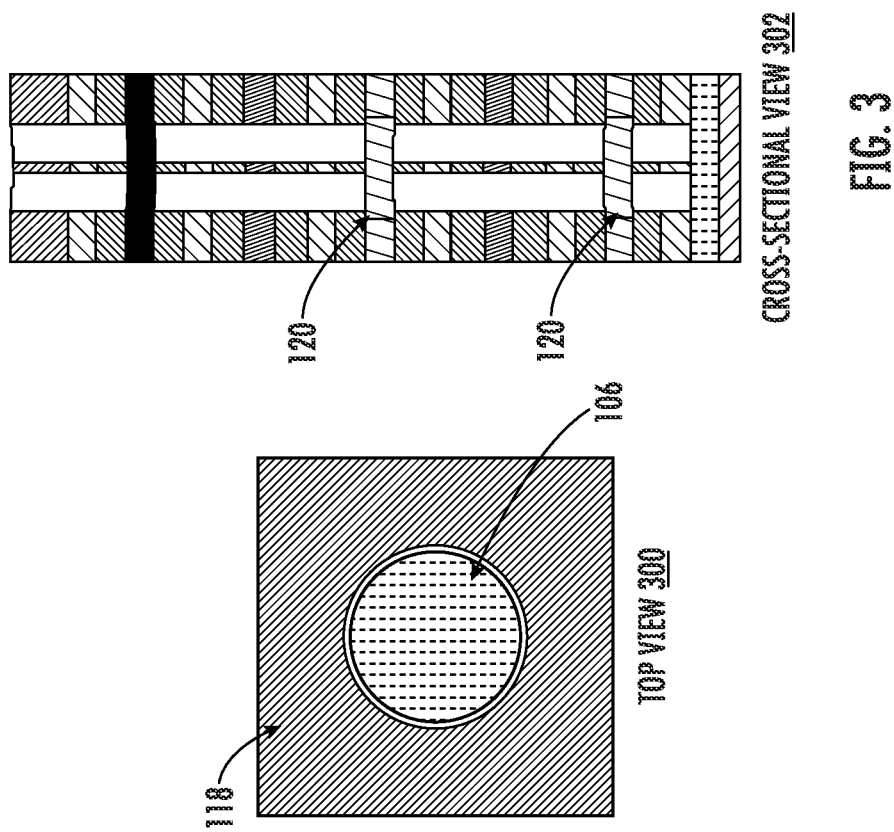
FIG. 3

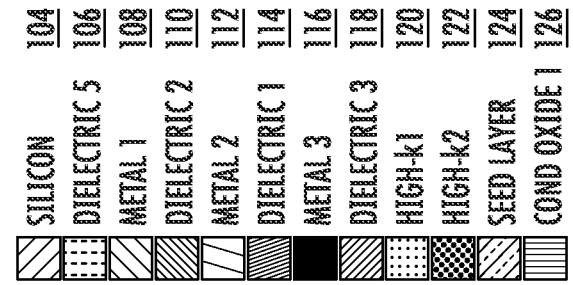
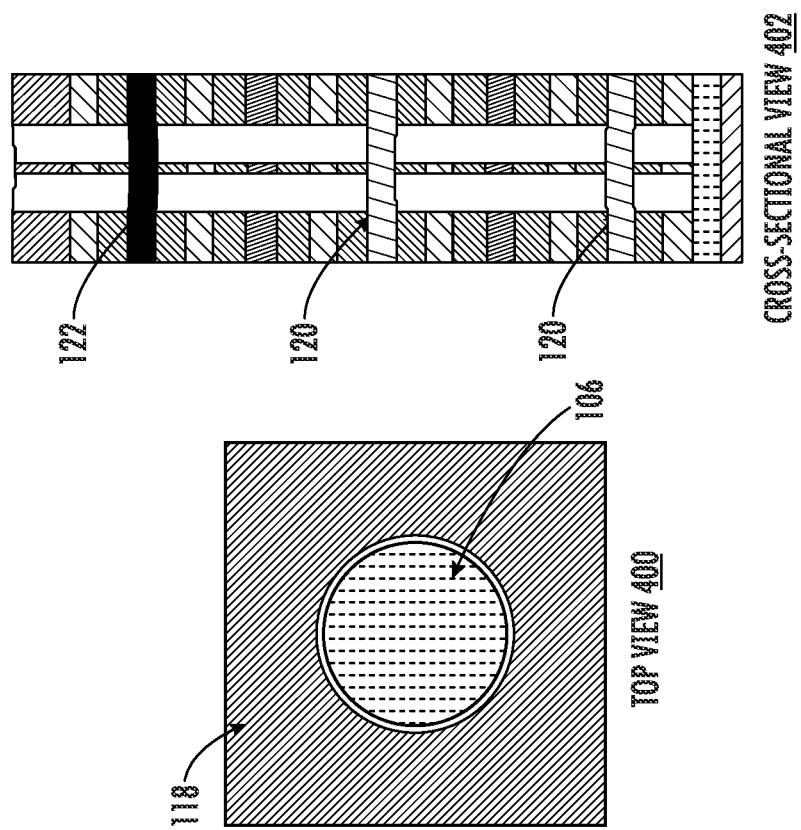
FIG. 4

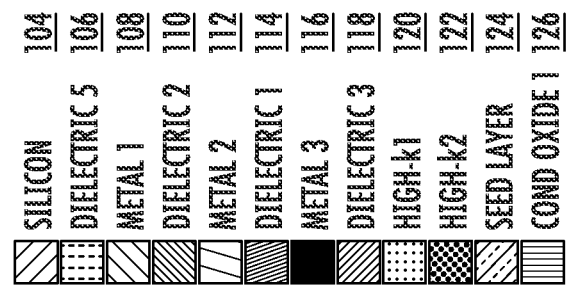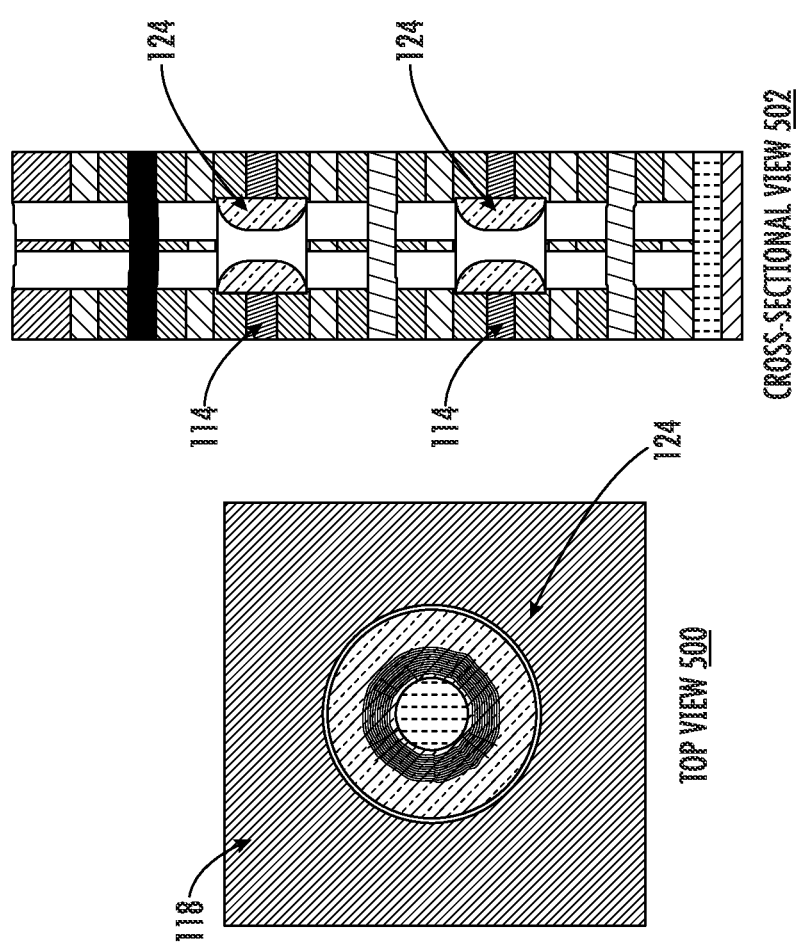
FIG. 5

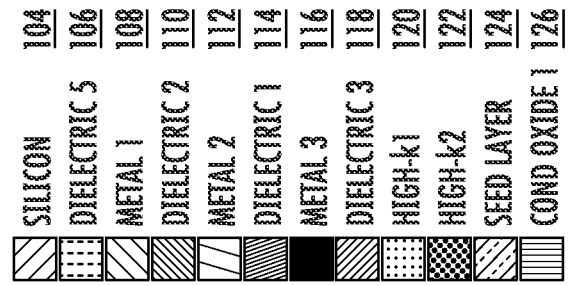
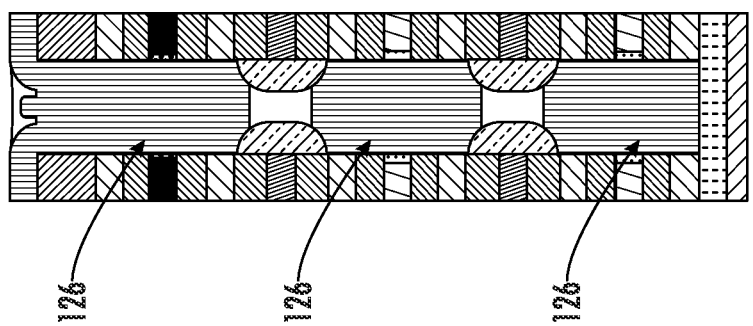
FIG. 6
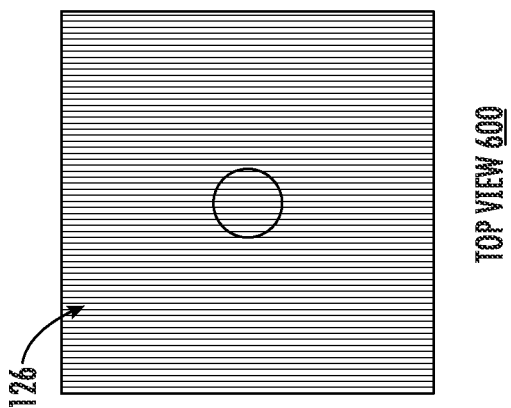

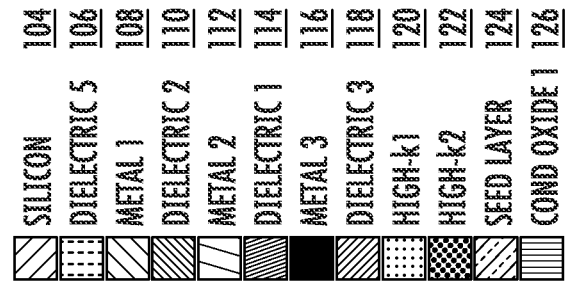
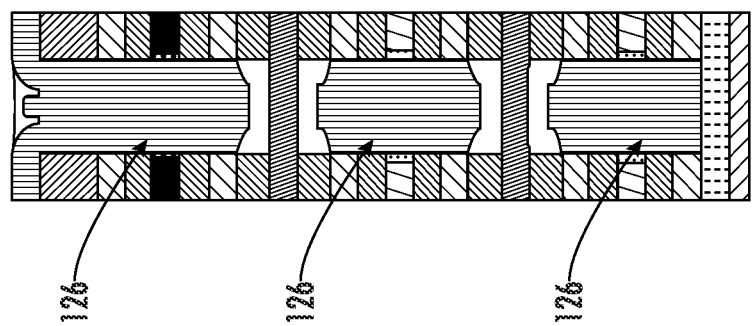
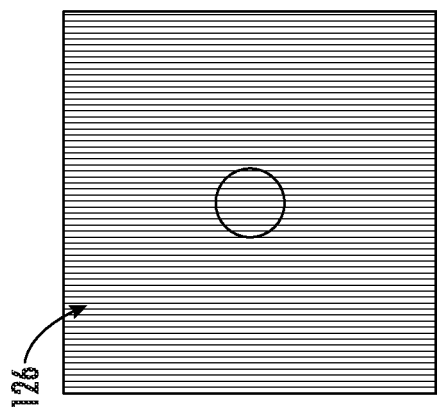
FIG. 8

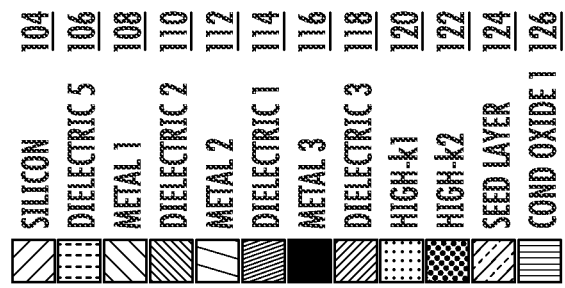
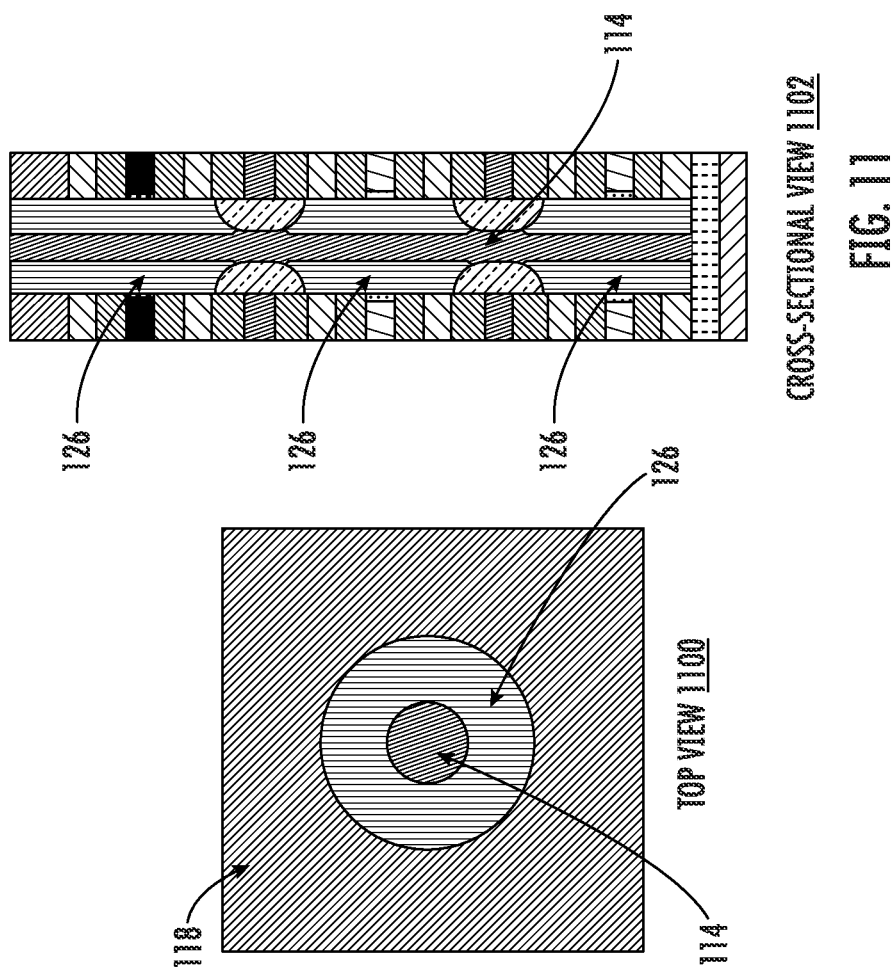
FIG. 11

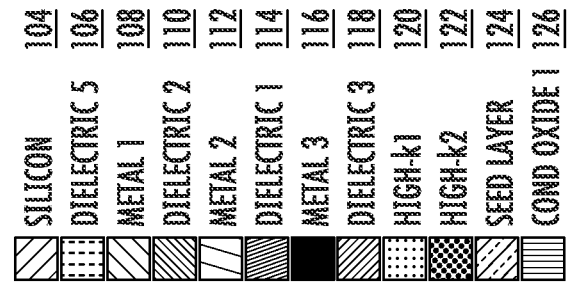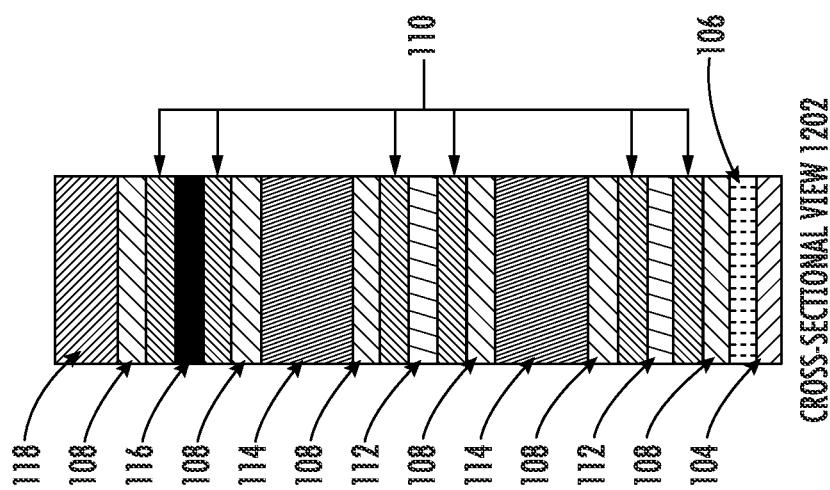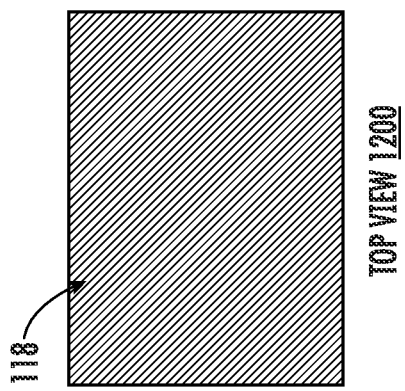
FIG. 12

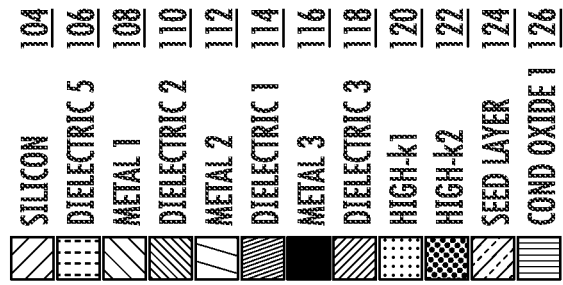
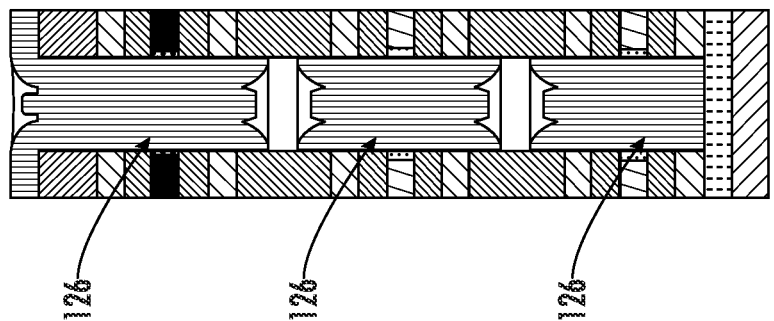
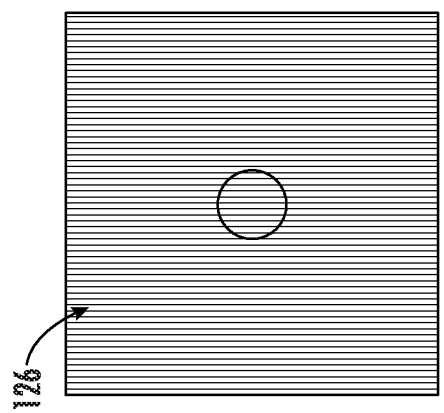
FIG. 14

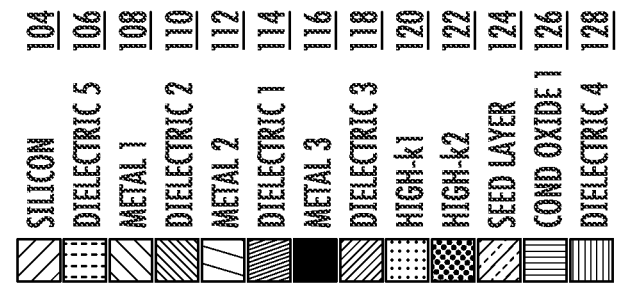
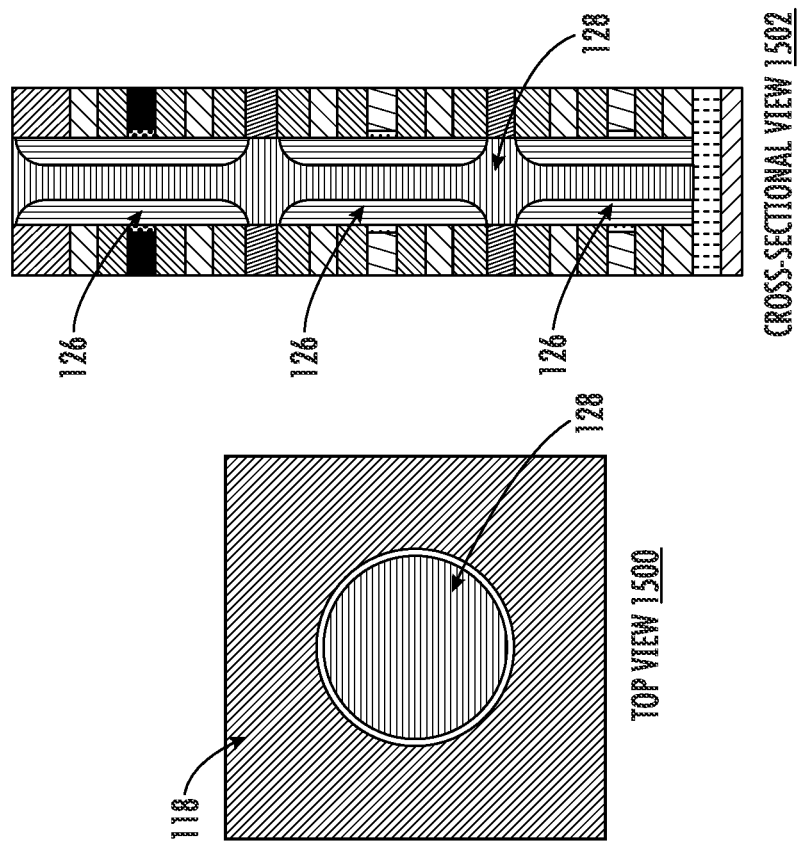
FIG. 15

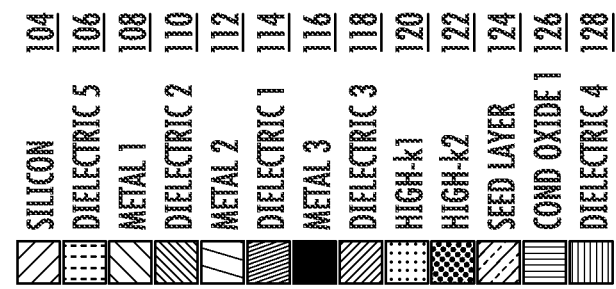
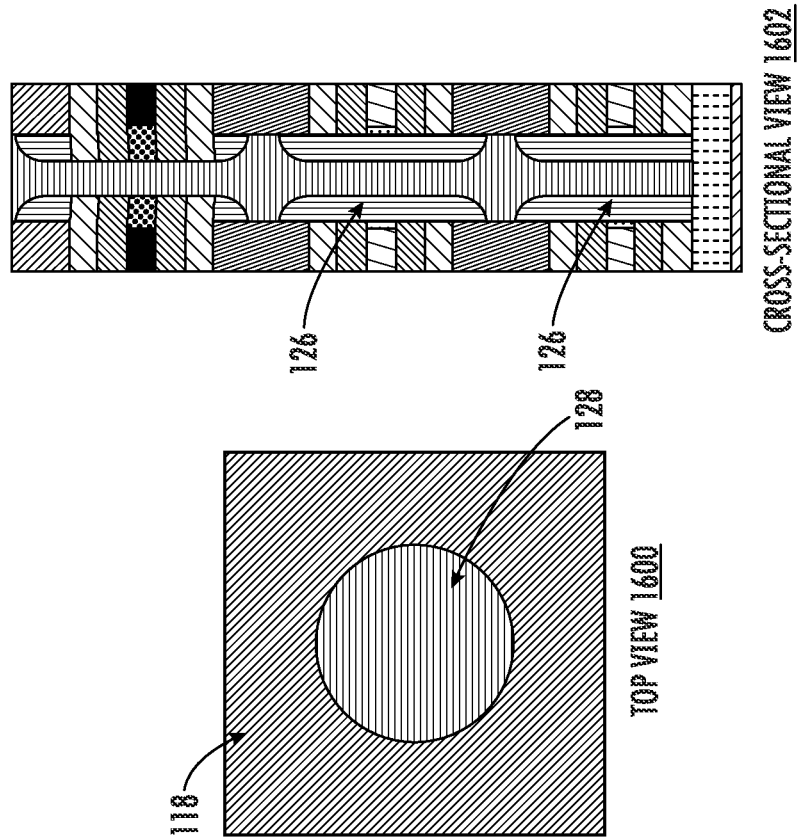
FIG. 16

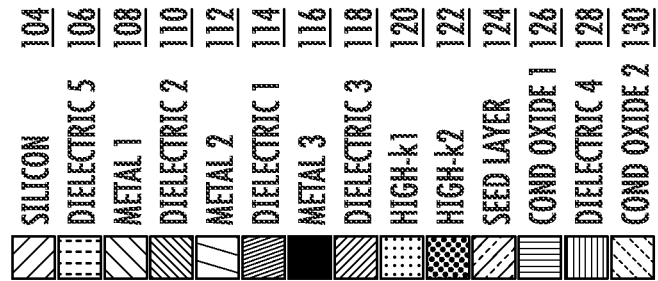
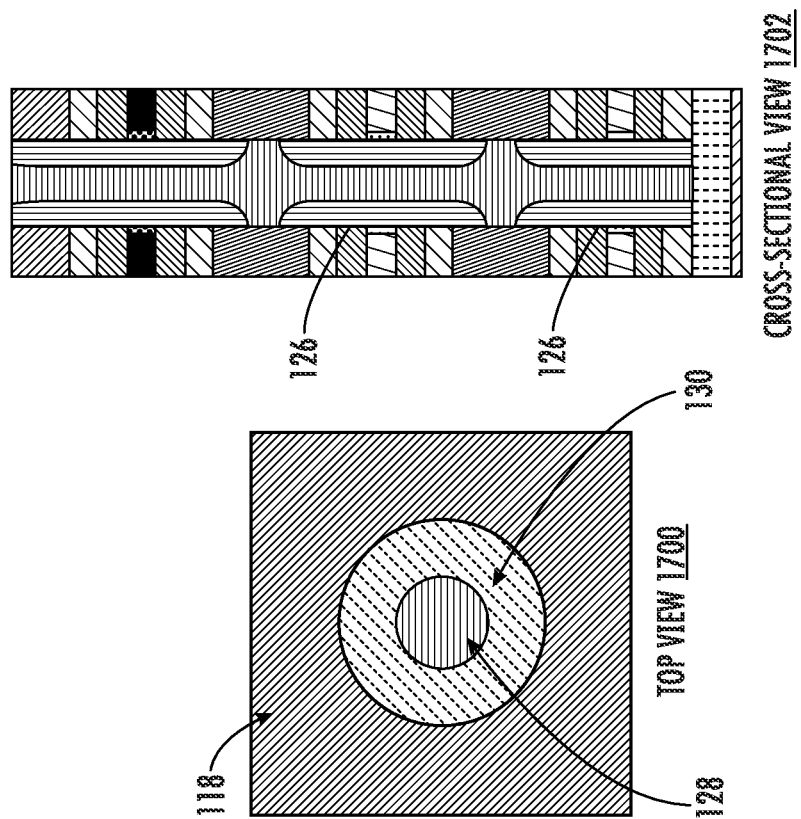
FIG. 17

1800

FORM A STACK OF LAYERS INCLUDING FORMING A STACK OF LAYERS INCLUDING A FIRST LAYER STACK INCLUDING AT LEAST THREE LAYERS OF THE AT LEAST ONE CONDUCTIVE MATERIAL SEPARATED BY ONE OR MORE LAYERS OF AT LEAST ONE DIELECTRIC MATERIAL, THE FIRST LAYER STACK ASSOCIATED WITH A FIRST TRANSISTOR STRUCTURE, AND A SECOND LAYER STACK INCLUDING AT LEAST THREE LAYERS OF AT LEAST ONE CONDUCTIVE MATERIAL SEPARATED BY ONE OR MORE LAYERS OF AT LEAST ONE DIELECTRIC MATERIAL, THE SECOND LAYER STACK ASSOCIATED WITH A SECOND TRANSISTOR STRUCTURE, THE FIRST AND SECOND TRANSISTOR STRUCTURES SEPARATED BY ONE OR MORE DIELECTRIC MATERIALS 1805

FORM A CHANNEL OPENING IN THE STACK 1810

SELECTIVELY FORM A FIRST CHANNEL STRUCTURE WITHIN THE CHANNEL OPENING, THE FIRST CHANNEL STRUCTURE COMPRISING A SEMICONDUCTIVE BEHAVING OXIDE MATERIAL AND ALIGNED WITH THE FIRST TRANSISTOR STRUCTURE 1815

SELECTIVELY FORM A SECOND CHANNEL STRUCTURE WITHIN THE CHANNEL OPENING, THE SECOND CHANNEL STRUCTURE COMPRISING A SEMICONDUCTIVE BEHAVING OXIDE MATERIAL AND ALIGNED WITH THE SECOND TRANSISTOR STRUCTURE 1820

FIG. 18

VERTICAL TRANSISTOR STRUCTURES AND METHODS UTILIZING SELECTIVE FORMATION

CROSS-REFERENCE TO RELATED APPLICATIONS

This application claims priority to U.S. Provisional Patent Application Ser. No. 63/219,508, filed Jul. 8, 2021, which is incorporated by reference in its entirety.

TECHNICAL FIELD

The present invention relates generally to the field of manufacturing semiconductor devices.

BACKGROUND

In the manufacture of a semiconductor devices (especially on the microscopic scale), various fabrication processes are executed, such as film-forming depositions, etch mask creation, patterning, material etching and removal, and doping treatments. These processes are performed repeatedly to form desired semiconductor device elements on a substrate. Conventional micro microfabrication techniques only manufacture transistors in one plane, while wiring or metallization is formed above the active device plane. Such devices are accordingly characterized as two-dimensional (2D) circuits, manufactured using 2D fabrication techniques. Although scaling efforts have greatly increased the number of transistors per unit area in 2D circuits, these 2D fabrication techniques are approaching physical atomic limitations with single digit nanometer semiconductor device fabrication nodes. Semiconductor device fabricators have expressed a desire for different manufacturing techniques and configurations of devices to increase density of semiconductor circuitry.

SUMMARY

Three-dimensional (3D) integration, e.g., a stacking (or vertical arrangement) of multiple semiconductor devices (e.g., transistor structures), aims to overcome scaling limitations experienced in planar devices by increasing transistor density in volume rather than area. Although device stacking has been successfully demonstrated and implemented by the flash memory industry with the adoption of 3D NAND, applying similar techniques to random logic designs is substantially more difficult. 3D integration for logic chips, including central processing units (CPU), graphics processing units (GPU), and field-programmable gate arrays (FPGA), are being pursued.

At least one aspect of the present disclosure is directed to a method for forming a stack of layers. The stack of layers can include a first layer stack including at least three layers of the at least one conductive material separated by one or more layers of at least one dielectric material. The first layer stack is associated with a first transistor structure. The stack of layers can include a second layer stack including at least three layers of at least one conductive material separated by one or more layers of at least one dielectric material. The second layer stack is associated with a second transistor structure. The first and second transistor structures separated by one or more dielectric materials. The method can include forming a channel opening in the stack. The method can include selectively forming a first channel structure within the channel opening, the first channel structure comprising any deposited layer, such as a semiconductive behaving oxide material and aligned with the first transistor structure. The method can include selectively forming a second channel structure within the channel opening, the second channel structure comprising any deposited layer, such as a semiconductive behaving oxide material and aligned with the second transistor structure.

In some implementations, the method can include forming a seed layer on the one or more dielectric materials separating the first and second transistor structures. In some implementations, at least one of the first channel structure or the second channel structure is formed selectively on areas other than the seed layer. In some implementations, the method may include removing the seed layer after selectively forming the first and second channel structures, thereby forming an air gap between the first and second channel structures. In some implementations, the method may include replacing the semiconductive behaving oxide material of the second channel structure with a second semiconductive behaving oxide material. The first channel structure and the second channel structure may be same material. In some implementations, the first channel structure and the second channel structure comprise different materials. In some implementations, the semiconductive behaving oxide material is de-selective to at least one of the one or more dielectric materials.

The semiconductive behaving oxide of the first channel structure may an N-type semiconductive oxide, and the semiconductive behaving oxide of the second channel structure is a P-type semiconductive oxide. In some implementations, each of the first layer stack and the second layer stack include at least one gate metal layer. In some implementations, the method can include recessing the at least one gate metal layer in each of the first layer stack and the second layer stack. In some implementations, the method can include depositing a gate dielectric the gate metal layer. In some implementations, selectively forming the first and second channel structures may include selectively forming the first and second channel structures on the first and second layer stacks, respectively, such that an air gap separates the first and second channel structures. In some implementations, the method may include forming a dielectric core in the air gap and in an opening extending through the first and second channel structures. In some implementations, the method may include replacing the semiconductive behaving oxide material of the second channel structure with a second semiconductive behaving oxide material.

At least one other aspect of the present disclosure is directed to a vertical field effect transistor (VFET) structure. The VFET transistor structure can include a stack of layers including a first layer stack including at least three layers of at least one conductive material separated by one or more layers of at least one dielectric material. The first layer stack is associated with a first transistor structure. The stack of layers can include a second layer stack including at least three layers of the at least one conductive material separated by one or more layers of the at least one dielectric material. The second layer stack associated with a second transistor structure. The first and second transistor structures can be separated by one or more dielectric materials. The VFET transistor structure can include a channel opening in the stack of layers. The VFET transistor structure can include a first channel structure within the channel opening. The first channel structure can include a semiconductive behaving oxide material and aligned with the first transistor structure. The VFET transistor structure can include a second channel structure within the channel opening. The second channel structure can include a semiconductive behaving oxide material and aligned with the second transistor structure. The VFET transistor structure can include an insulating layer interposed between the first and second channel structures.

The insulating layer can include a seed layer positioned on the one or more dielectric materials separating the first and second transistor structures. In some implementations, the seed layer electrically separates the first channel structure and the channel structure. In some implementations, the first channel structure and the second channel structure comprise different materials. In some implementations, the first channel structure and the second channel structure comprise the same materials.

WM The semiconductive behaving oxide of the first channel structure may be an N-type semiconductive oxide. In some implementations, the semiconductive behaving oxide of the second channel structure is a P-type semiconductive oxide. In some implementations, each of the first layer stack and the second layer stack comprise at least one gate metal layer upon which a gate dielectric is deposited.

At least one other aspect of the present disclosure is directed to a complementary vertical field effect transistor (CFET) structure. The CFET structure can include a stack of layers. The stack of layers can include a first layer stack including at least three layers of the at least one conductive material separated by one or more layers of at least one dielectric material. The first layer stack is associated with a first transistor structure. The stack of layers can include a second layer stack including at least three layers of at least one conductive material separated by one or more layers of at least one dielectric material. The second layer stack is associated with a second transistor structure. The first and second transistor structures are separated by one or more dielectric materials. The CFET structure can include a channel opening in the stack of layers. The CFET structure can include a first channel structure within the channel opening. The first channel structure can include a semiconductive behaving oxide material and providing a p-type or n-type channel for the first transistor structure. The CFET structure can include a second channel structure within the channel opening. The second channel structure can include a semiconductive behaving oxide material and providing a P-type or N-type channel for the second transistor structure, the channel type being different than the first channel structure. The CFET structure can include an insulating layer interposed between the first and second channel structures.

The insulating layer can include a seed layer positioned on the one or more dielectric materials separating the first and second transistor structures. In some implementations, the seed layer electrically separates the first channel structure and the channel structure. In some implementations, the first channel structure and the second channel structure comprise different materials.

The first channel structure and the second channel structure may comprise the same materials. In some implementations, the semiconductive behaving oxide of the first channel structure is an N-type semiconductive oxide. In some implementations, the semiconductive behaving oxide of the second channel structure is a P-type semiconductive oxide. In some implementations, each of the first layer stack and the second layer stack comprise at least one gate metal layer upon which a gate dielectric is deposited.

At least one other aspect of the present disclosure is directed to a VFET structure. The VFET structure can include a stack of layers including at least three layers of at least one conductive material separated by one or more layers of at least one dielectric material. The stack of layers is associated with a transistor structure. The VFET structure can include a channel opening in the stack of layers. VFET structure can include a channel structure within the channel opening. The channel structure can include a deposited material and aligned with the transistor structure.

In some implementations, the deposited material can be a semiconductive behaving oxide material.

These and other aspects and implementations are discussed in detail below. The foregoing information and the following detailed description include illustrative examples of various aspects and implementations, and provide an overview or framework for understanding the nature and character of the claimed aspects and implementations. The drawings provide illustration and a further understanding of the various aspects and implementations, and are incorporated in and constitute a part of this specification. Aspects can be combined and it will be readily appreciated that features described in the context of one aspect of the invention can be combined with other aspects. Aspects can be implemented in any convenient form. As used in the specification and in the claims, the singular form of 'a', 'an', and 'the' include plural referents unless the context clearly dictates otherwise.

BRIEF DESCRIPTION OF THE DRAWINGS

Non-limiting embodiments of the present disclosure are described by way of example with reference to the accompanying figures, which are schematic and are not intended to be drawn to scale. Unless indicated as representing the background art, the figures represent aspects of the disclosure. For purposes of clarity, not every component may be labeled in every drawing. In the drawings:

FIGS. 1-7 show top and cross-sectional views of a first process flow to form 3D vertical semiconductor devices, according to an embodiment;

FIGS. 8 and 9 show top and cross-sectional views of a second process flow for forming 3D vertical semiconductor devices, according to an embodiment;

FIGS. 10 and 11 show top and cross-sectional views of a third process flow for forming 3D vertical semiconductor devices, according to an embodiment;

FIGS. 12-15 show top and cross-sectional views of a fourth process flow for forming 3D vertical semiconductor devices, according to an embodiment;

FIGS. 16 and 17 show top and cross-sectional views of a fifth process flow for forming 3D vertical semiconductor devices, according to an embodiment; and FIG. 18 shows a flow diagram of an example method for fabricating transistor structures using the process flows described in connection with FIGS. 1-17, according to an embodiment.

DETAILED DESCRIPTION

Figure 1:
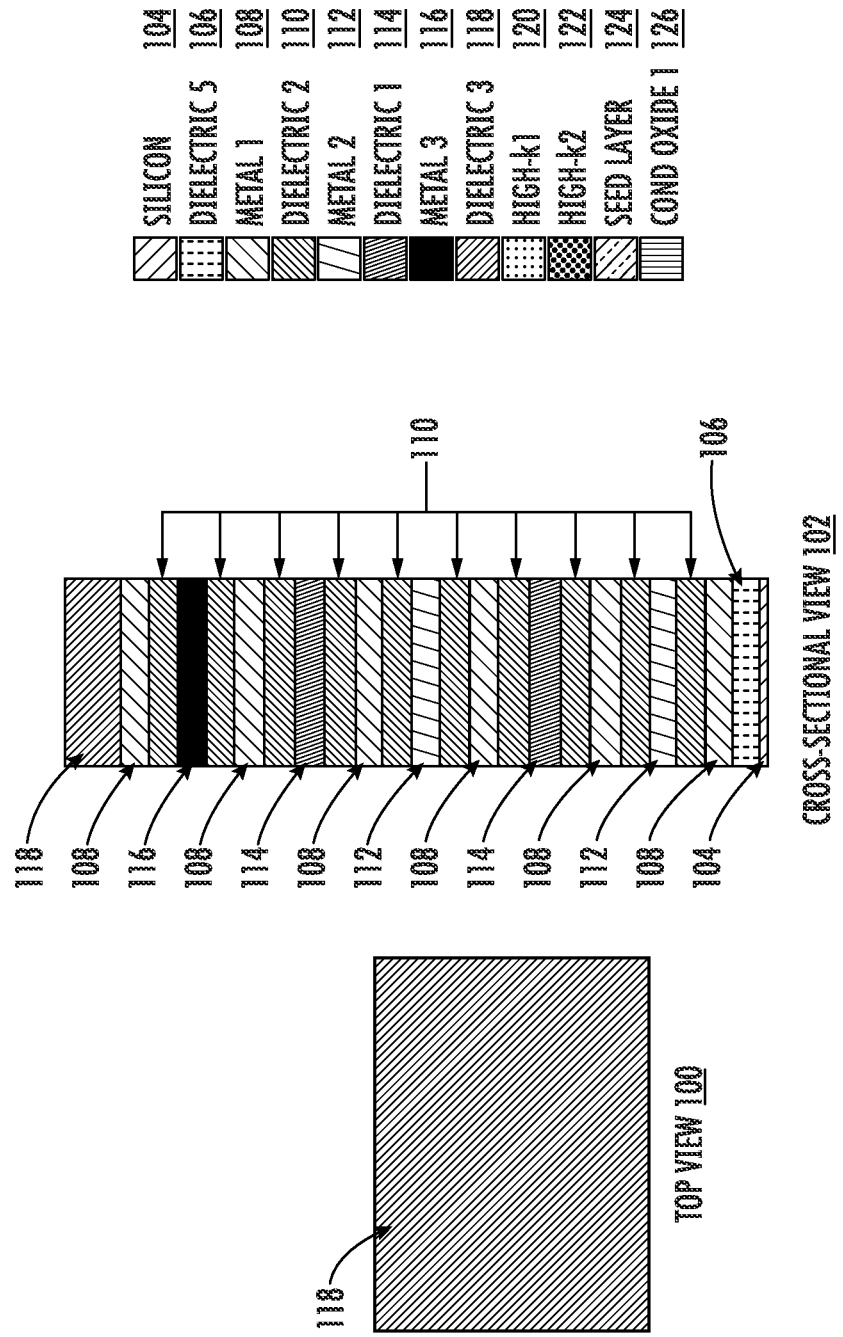

Reference will now be made to the illustrative embodiments depicted in the drawings, and specific language will be used here to describe the same. It will nevertheless be understood that no limitation of the scope of the claims or this disclosure is thereby intended. Alterations and further modifications of the inventive features illustrated herein, and additional applications of the principles of the subject matter illustrated herein, which would occur to one skilled in the relevant art and having possession of this disclosure, are to be considered within the scope of the subject matter disclosed herein. Other embodiments may be used and/or other changes may be made without departing from the spirit or scope of the present disclosure. The illustrative embodiments described in the detailed description are not meant to be limiting of the subject matter presented.

This application relates to vertically oriented transistor devices and their methods of manufacture. More specifically, described herein are structures in which the current between the drain and source is primarily in the direction normal to the surface of the die, e.g., vertical field-effect transistor (VFET) and Complementary Field Effect Transistor (CFET) structures.

Logic devices are conventionally formed in horizontal planar configurations. However, limitations on the amount of area and required density of devices in a given footprint increasingly necessitate the use of novel structures. The present application provides devices oriented in a vertical, or 3D, direction. Devices are oriented such that current flows in the vertical or z-direction allowing arrays of transistors to be stacked relative to the primary planar surface of the array or underlying substrate.

According to the techniques described, 3D VFET devices may be created on any suitable substrate including conductive, semiconductive, or dielectric substrates. The underlying substrate may be a passive structure such as a handle wafer or passive interposer, or may have active devices, such as memory devices, circuitry, etc. Advantageously, VFETS may be provided above other active devices allowing for close proximity between devices. The VFETS may also be stacked as all one conductivity type, e.g., N-type or P-type or the conductivity type may be combined, such one or more N-type devices over or under one or more P-type devices in the stack. Such configurations may include, but are not limited to so-called CFETs, e.g., complementary Field Effect Transistors. CFET structures may include a gate-all-around (GAA) structure.

According to certain implementations, one or more transistor structures are formed by stacking layers to form a source (or drain), gate, and drain (or source) separated by one or more dielectric layers to isolate each portion of the transistor. The channel may be oriented in a z-direction, i.e., perpendicular to the direction that the layers are stacked. A high k dielectric material may be provided between the gate and the channel as will be described more fully below. At least two general process flows, labeled Flow A and Flow B, will be described below as example processes. These processes may be combined or augmented without departing from the scope of this disclosure.

Some examples of N-type conductive channels include $In_2O_3$, $SnO_2$, InGaZnO, and ZnO. One example of a P-type conductive channel is SnO. Additionally or alternatively, the channel may comprise a 2D material. Some example 2D materials for use in forming the channel include, but are not limited to, $WS_2$, $WSe_2$, $WTe_2$, $MoS_2$, $MoSe_2$, $MoTe_2$, $HfS_2$, $ZrS_2$, and $TiS_2$, GaSe, InSe, phosphorene, and other similar materials. These materials may be deposited by an atomic layer deposition (ALD) process and may be, for example, 5-15 angstroms thick, the thinness lending to their name—2D material. The materials may be annealed during or after the device formation process to recrystallize or grow the crystals and thereby improve electrical characteristics. For the sake of simplicity, the use of conductive dielectrics will be disclosed.

Further, various techniques may be implemented to form the high-k barrier between the conductive channels and the gate electrode. One such technique utilizes a selective deposition of a high-k dielectric to form the transistor gates. In some implementations, a gate-recessing technique is utilized to allow a more uniform layer of doped conductive oxide material to form along the sidewall of the opening. Another similar technique provides a non-selective deposition of the high-k dielectric in the gate-recessed opening in conjunction with self-aligned directional etching. These techniques may also be implemented to fabricate stacked transistors of the same type by utilizing the same conductive oxide for two or more transistor layers. These and other aspects are described in further detail herein.

Reference will now be made to the Figures, which for the convenience of visualizing the 3D fabrication techniques described herein, illustrate a substrate undergoing a process flow in both top and cross-sectional views. Unless expressly indicated otherwise, each Figure represents one (or a set) of fabrication steps in a process flow for manufacturing the devices described herein. In the top and cross-sectional views of the Figures, connections between conductive layers or materials may be shown. However, it should be understood that these connections between various layers and masks are merely illustrative and are intended to show a capability for providing such connections and should not be considered limiting to the scope of the claims.

Likewise, although the Figures and aspects of the disclosure may show or describe devices herein as having a particular shape, it should be understood that such shapes are merely illustrative and should not be considered limiting to the scope of the techniques described herein. For example, although most of the figures show various layers defining transistor structures or other electric structures in a circular configuration, other shapes are also contemplated, and indeed the techniques described herein may be implemented in any shape or geometry. In addition, examples in which two transistors or devices are shown stacked on top of one another are shown for illustrative purposes only, and for the purposes of simplicity. Indeed, the techniques described herein may provide for one to any number N stacked devices. Although the devices fabricated using these techniques are shown as transistors, it should be understood that any type of electric or electronic device may be manufactured using such techniques, including but not limited to transistors, variable resistors, resistors, and capacitors.

FIGS. 1-7 show a process flow for the manufacture of 3D VFET or CFET transistor stacks, or other types of electric or electronic devices. Each of the FIGS. 1-7 generally refer to one or more process steps in a process flow, each of which are described in detail in connection with the respective Figure. For the purposes of simplicity and ease of visualization, some reference numbers may be omitted from some Figures. As used herein, the terms "first," "second," "third," and "fourth" with respect to particular layers of the stack shown in FIGS. 1-7 refer to the order of the layers relative to the substrate 104. For example, a "first" layer of a particular type refers to the specified type of layer which is closest to the substrate 104. Likewise, a "second" layer of a particular type refers to the specified type of layer which is second closest to the substrate 104, and so on. Referring to FIG. 1, illustrated is a top view 100 and a cross-sectional view 102 of a stack of layers of a device. A substrate 104 (e.g., Si, shown as "Silicon" in the legend) is provided which may be active or passive and may comprise dielectric, conductive or semiconductive materials or any combination thereof. One or more first dielectric layers 106 (e.g., shown as "Dielectric 5" in the legend) may be provided on the substrate 104 to isolate the VFET structure from the underlying substrate. The dielectric materials described herein may be any type of dielectric material that is capable of being disposed, patterned, or otherwise provided on the various layers described herein. Some examples of dielectric materials can include, but are not limited to, oxide materials.

The substrate 104 may remain in the final structure or may be removed during or after the formation of the VFET structure. The term source/drain (S/D) will be used to describe layers that may be used as either a source or a drain of a transistor structure. The first S/D layer 108 (e.g., shown as "Metal 1" in the legend) may be formed directly on the substrate 104 or on the one or more dielectric layers 106 described above. The S/D layers 108 may be any type of conductive metal suitable to form a source or drain electrode in a semiconductor device, including copper, gold, silver, platinum, nickel, tungsten, ruthenium, or other types of conductive metals or alloys. An insulating dielectric 110 (e.g., shown as "Dielectric 2" in the legend) is formed on the first S/D layer 108. The deposition or addition of layers in the stack may be performed using any type of material deposition technique, including but not limited to ALD, chemical vapor deposition (CVD), and physical vapor deposition (PVD).

A gate layer 112 (e.g., shown as "Metal 2" in the legend) may then be formed on top of the first insulating layer 110. A second insulating layer 110 and then a second S/D layer 108 may be formed on the gate layer 112. The gate layer 112 may be a different material than the first and second S/D layers 108. A third insulating layer 110 may then be deposited on top of the second S/D layer 108 to complete a first transistor structure. As shown in the cross-sectional view 102, a transistor structure can include four dielectric layers (with the first transistor having one dielectric layer be the dielectric layer 106, which separates the first transistor structure from the substrate 104) and three conductive metal layers (e.g., the two S/D layers 108 and one gate layer 112).

Subsequent transistor structures may be stacked above the first transistor structure, by depositing similar layers. One or more insulating dielectric layers 114 may be deposited between adjacent transistor structures. These layers in the stack of layers may be formed without a mask, such that each layer forms a blanket layer over the prior layer. Once the layers are formed, each VFET structure or vertical group of VFET structures may be patterned to separate adjacent transistor structure stacks isolated in the x-y plane (e.g., where the x-y plane is perpendicular to the z-direction). As this pattern process is well described and documented elsewhere, it will not be expounded upon here in the interest of brevity and focus. Additionally, electrical connections between transistor structures may be formed by patterning the conductive layers described herein, as well as by forming vias to electrically connect different layers. As such, transistor stacks that are isolated in the x-y plane may be electrically connected with one another to form logical or electronic circuits.

As shown in this example process flow, at least three layers of dielectric 114 may be utilized to isolate adjacent transistors from each other. As will be further described below, this will allow a central dielectric (e.g., the dielectric layer 114) to have a seed layer selectively grown on it such that any overgrowth or over-deposition extends over adjacent dielectric layers (e.g., the dielectric layers 110) and does not cover nearby S/D layers 108. Once the desired number of transistors stacks have been formed, a final dielectric layer 118 (shown as "Dielectric 3" in the table, may be formed. Different types of gate metals may be used to form different types of transistors, or to form transistors with desired electronic properties. As shown in the cross-sectional view 102, the third transistor structure has a gate layer formed from a layer of metal 116 (shown in the legend as "Metal 3"). Different metals may be used to pattern or use different high-k gate dielectrics (e.g., the high-k dielectric 120 or the high-k dielectric 122), which may be suitable for either N-type or P-type vertical transistors.

Once the stack of layers has been constructed using material deposition techniques, the process flow proceeds to the next stage shown in FIG. 2. FIG. 2 illustrates a top view 200 and a cross-sectional view 202 of a device. Either before or after patterning the structures, one or more channels (sometimes referred to as a "transistor body openings") may be formed. To form the channels, a mask (e.g., of a photoresist or other suitable masking material) may be formed over the final dielectric layer 118, with openings that define the x-y cross-section of the channels (shown here as a circle). One or more etch techniques may be performed to remove the portion of the underlying layers aligned with the opening in the mask to form the transistor body opening. Any type of suitable etching techniques may be used, including but not limited to dry etching, wet etching, or plasma etching techniques. The mask may be removed once the channel openings are defined or may be retained to protect the underlying surface or to remain as part of the final structure.

FIG. 3 illustrates a top view 300 and a cross-sectional view 302 of a device shown in the next stage of the example process flow. Once the channel opening(s) are defined, one or more of the gate layers 112 may be etched slightly in the x-y direction (e.g., outward from the center of the transistor body opening) to recess the gate from the channel. The etching process may be a selective etching process that etches the gate layers 112 to create recessed regions of a predetermined volume, by etching the gate layers 112 (the gate metal) by a predetermined amount. A gate dielectric, such as a high-k dielectric 120, may be selectively formed on the gate layer. The high-k dielectric can be grown such that a predetermined amount of high-K dielectric 120 fills the recessed region of the gate layers 112. Additionally or alternatively, the high-K dielectric 120 may be formed on recessed or non-recessed gate layer 112 so as to extend into the channel opening. The high-k dielectric 120 material may be selected to have desired attributes or properties, such as a desired dielectric constant. Likewise, the high-k dielectric 120 may be grown to create a predetermined separation distance between the gate layer 112 and the central channel of the transistor structure.

The high-k dielectric 120 and the high-k dielectric 122 can be any type of material that has a relatively large dielectric constant. As one example, a silicon oxide based gate dielectric such as silicon dioxide ($SiO_2$) may be selectively formed on a gate layer of silicon. Additionally or alternatively, other gate dielectric materials may be utilized such as silicon oxynitride ($SiO_xN_y$), silicon nitride ($Si_3N_4$), alumina ($Al_2O_3$), lanthanum oxide ($La_2O_3$), zirconium oxide ($ZrO_2$), hafnium oxide ($HfO_2$), hafnium zirconium oxide (HfZrO), tantalum oxide ($Ta_2O_5$), hafnium silicon oxide ($HfSiO_4$), zirconium silicon oxide ($ZrSiO_4$), titanium oxide ($TiO_2$), strontium titanium oxide ($SrTiO_3$), hafnium silicon oxynitride ($HfSiO_xN_y$), zirconium silicon oxynitride ($ZrSiO_xN_y$), hafnium oxynitride ($HfO_xN_y$), zirconium oxynitride ($ZrO_xN_y$), other suitable materials and combinations thereof. The resulting gate dielectric may be formed (or formed and then etched) to be slightly recessed, flush or slightly protruding relative to the channel opening depending on the desired device characteristics and process parameters.

If multiple devices, such as N-type and P-type devices, are exposed in the opening, suitable dielectrics and thicknesses may be provided to each gate to achieve the desired characteristics. Deposition control may be achieved using specific materials for each gate layer 112 and selecting the gate dielectric 120 to form selectively on that gate layer. At a next stage of the process flow, FIG. 4, illustrates a top view 400 and a cross-sectional view 402 of a device. As shown, a second high-k dielectric 122 may be selectively formed on the gate layer 116. A directional etching may be used to clean the second high-k dielectric 122 outside of the groove on the gate layer 116. The second high-k dielectric 122 may be a different material than the first high-k dielectric 120 and may be deposited following an etching process to recess the gate layer 116.

Referring to the next stage of the process flow in FIG. 5, illustrated is a top view 500 and a cross-sectional view 502 of a device. In this stage, a seed layer 124 may be selectively deposited on the dielectric layer 114 separating adjacent transistor structures in the stack of layers. The seed layer 124 may deposit or grow in multiple directions extending from the underlying dielectric layer 114. The stack of layers may be structured to accommodate for such growth. For example, as shown, additional dielectric layers 110 were deposited to surround the dielectric layer 114 on which the seed layer 124 is grown, to prevent the seed layer 124 from insulating the S/D layers 108 from the central channel. Thus, it is advantageous to have additional layers of dielectric 110 on either side of the dielectric upon which the seed layer is grown or deposited. As an example, the isolation region (e.g., the dielectric 114) between transistors may comprise $SiO_2$ or $SiO_xN_y$.

FIG. 6 illustrates a top view 600 and a cross-sectional view 602 of a device at the next stage in the process flow. One or more semiconductive-behaving materials 126 (e.g., shown as "Cond Oxide 1" in the legend) are then provided within the channel openings. The semiconductive-behaving material 126 (sometimes referred to as a "channel material 126" or "deposited material 126") may be any type of conductive oxide material with semiconductive properties. Although the example embodiments may show or describe the deposited material as a semiconductive-behaving material, the deposited material may be a conductive oxide, 2D material, or other similar material and combinations thereof. Additionally, or alternatively, one or more of the channel materials may include an epitaxially grown or polycrystalline deposited semiconductor, such as Si, Ge, or GaAs, among others. In certain embodiments, the semiconductive-behaving material forms selectively on the walls of the channel opening except where the seed layer is formed. Thus, the semiconductive-behaving material does not grow on the seed layer or at least grows at a much slower rate than on other layers such as the S/D layer and gate dielectric. An etching technique may be performed to remove excess material.

The semiconductive-behaving material 126 could be any doped or un-doped semiconductor material compatible with the NMOS and PMOS transistor for the device architecture (e.g., Si, Ge, GaAs, SiC, SiGe). Alternatively, the semiconductive-behaving material may be formed using certain elements that, when combined with oxygen, form a new material that exhibits semiconductive behavior, e.g., the material can be "turned off" with a low off state leakage current or can be "turned on" and become highly conductive when voltage is applied. Such materials may be referred to as conductive oxides or conductive dielectrics. Example materials to create an N-type channel include, but are not limited to, $In_2O_3$, $SnO_2$, InGaZnO, and ZnO. A P-type channel may be formed utilizing, for example, SnO. These materials may be further doped to improve the electrical characteristics.

The semiconductive-behaving material may then be etched, if needed, or otherwise selectively formed such that the level of the semiconductive-behaving material is at or around the same level as the uppermost S/D layer 108 for each transistor structure. The semiconductive-behaving material 126 may be formed to have an opening, thereby allowing the electrical characteristics of the channel region be defined based on the thickness of the remaining layer. This forms a donut or ring-shaped channel cylinder that is defined on its outermost edge by the channel opening and, if applicable, the gate dielectric layers 112.

Figure 7:
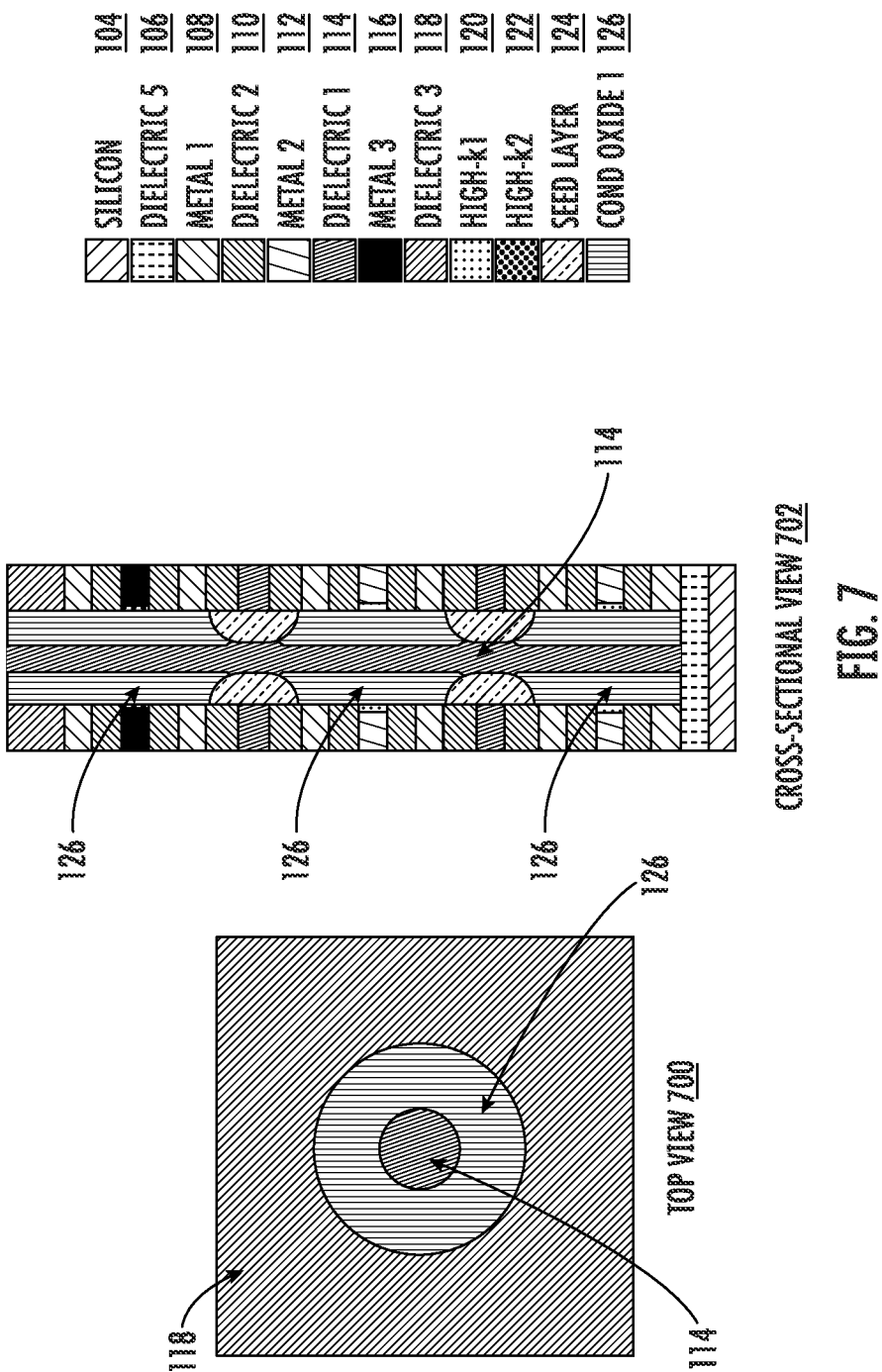

FIG. 7 illustrates a top view 700 and a cross-sectional view 702 of a device at the next stage in the process flow. As shown, once one or more suitable etchants are utilized to define a core area in the semiconductive-behaving materials 126 and/or seed layers 124 resulting in controlled channel regions with constant or varying cross-section in the z-direction, the core area may be filled with a dielectric 114. The dielectric 114 may be deposited using any suitable deposition technique. By creating a central core in the semiconductive-behaving materials 126, the overall volume of the semiconductive-behaving materials 126 is reduced, and therefore the amount of energy needed to turn the corresponding transistor stack to the "on" state is reduced. The volume of the central core through the transistor stacks can be selected to achieve desired electrical characteristics of the resulting transistors or electronic devices. Additionally or alternatively, some or all of the core area may be left empty to leave an air gap (not shown). If an air gap is desired, the core area may be sealed at an upper end using a capping material to prevent unwanted debris, liquid, moisture, or other material from entering the gap and potentially affecting the devices.

FIG. 8 illustrates a top view 800 and a cross-sectional view 802 of a device following a different process flow following the processes depicted up to and including FIG. 6. As shown in the cross-sectional view 802, following the deposition of the semiconductive-behaving materials 126, one or more etching techniques may be used to remove the seed layer 124. This leaves the semiconductive-behaving materials 126 bound to the surfaces of the central channel, while leaving a gap between each of the semiconductive-behaving materials 126 coupled to each transistor structure. In some implementations, a similar etching process may be performed to define a core area in the semiconductive-behaving materials 126. In some implementations, the core area may be defined prior to removing the seed layer 124.

For a multiple stacked VFET structure, such as a CFET stack, an additional semiconductive-behaving material may be formed to create a second channel region with characteristics different than those of the underlying devices. The additional semiconductive-behaving material may be the same material as the underlying semiconductive-behaving material 126, or it may be different, though the materials indicated above may be used. For example, utilizing different semiconductive-behaving type materials than underlying devices may provide different types of devices (N-type/P-type or P-type/N-type, for example). Moreover, semiconductive oxides may be used for one channel structure and epitaxial or polycrystalline semiconductor materials may be used for another channel structure. The channel regions may each be formed and, in some cases, etched to different thicknesses to control the final channel depth for each device in the stack. The process may be repeated to provide an array of transistors in both the x, y, and z directions.

Figure 9:
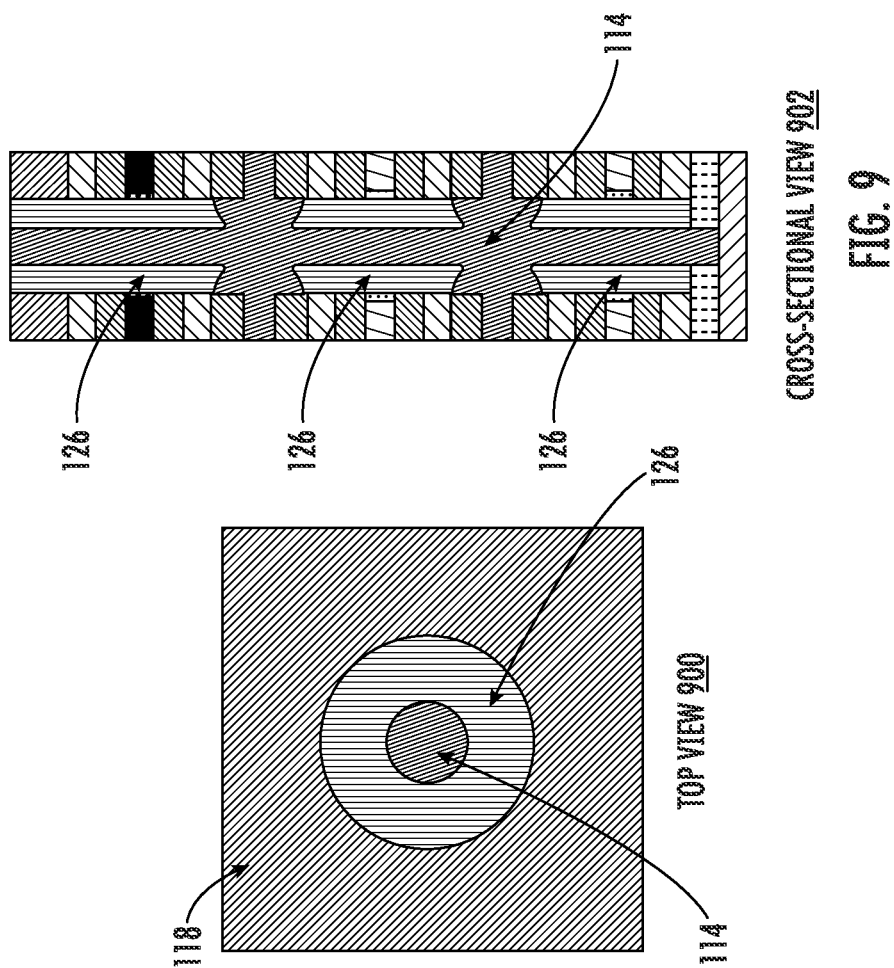

FIG. 9 illustrates a top view 900 and a cross-sectional view 902 of a device following the process flow shown in FIG. 8. As shown in the cross-sectional view 902, the semiconductive-behaving material 126 may be etched directionally to define a core area in the semiconductive-behaving materials 126. The core area can be defined to a predetermined volume to achieve desired characteristics of the transistor devices. After the core area is defined, the dielectric 114 may be deposited in the core area and the gaps left when removing the seed layer 124, using similar processes to those described in connection with FIG. 7. The dielectric material used to fill the core area may be different than the other dielectrics used in the device. As shown in the cross-sectional view 902, the dielectric material used to fill the core area and the gaps left by the seed layers 124 is the same dielectric material 114 used to isolate each transistor structure from one another. In some implementations, one or more of the seed layers may be removed before forming any dielectric in the core area. Alternatively, these gaps may be left empty to leave an air gap (not shown). Again, if an air gap is desired in this this structure, the core area may be sealed with a capping material (e.g., following the final stages in the process flow) to prevent unwanted debris, liquid, moisture, or other material from entering the gap and potentially affecting the devices.

Figure 10:
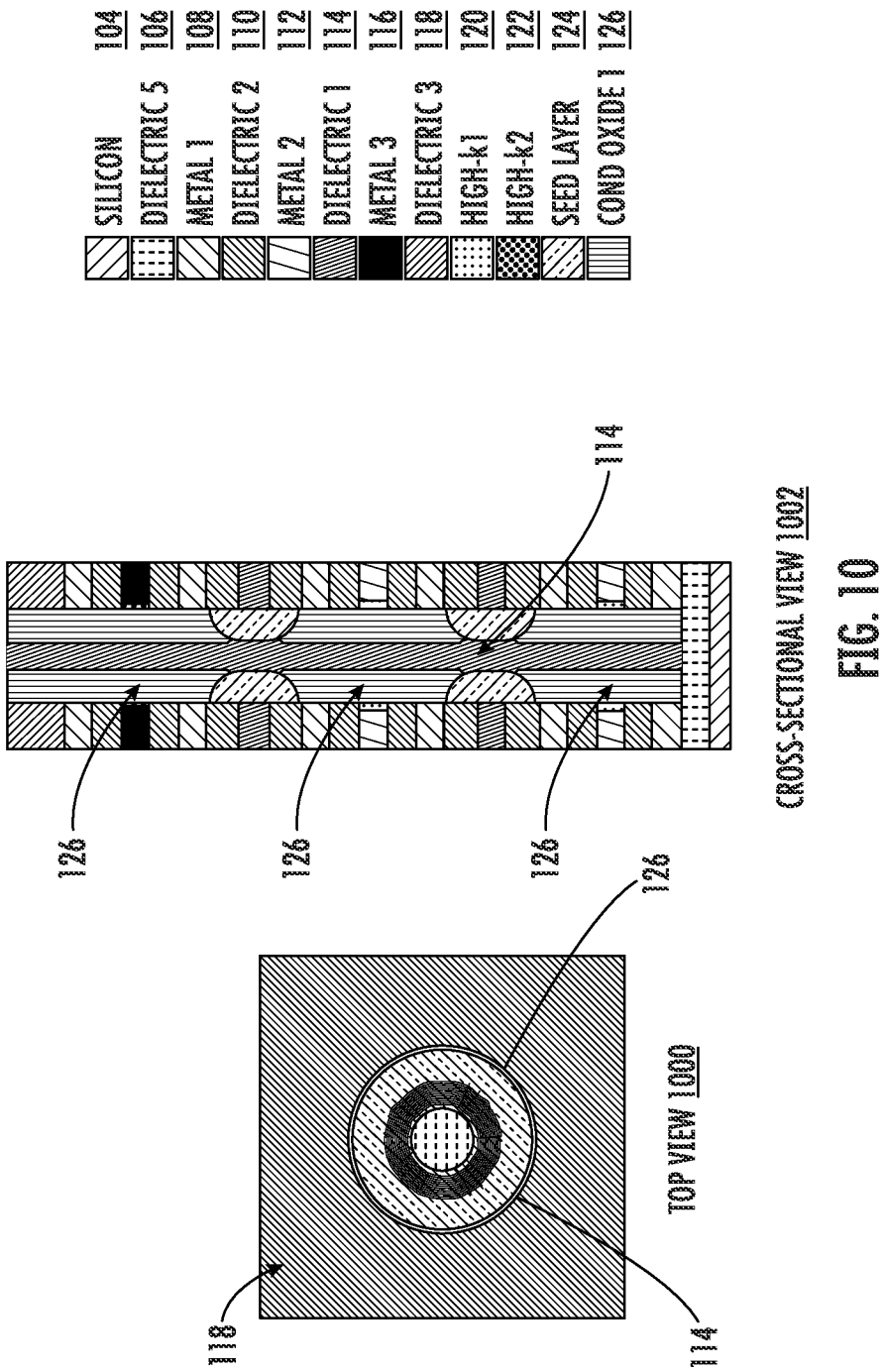

FIG. 10 illustrates a top view 1000 and a cross-sectional view 1002 of a device at the stage in the process flow following that described in connection with FIG. 7. After the step shown in FIG. 7, the semiconductive-behaving material 126 may be directionally etched using a selective etching technique. The etching technique used may be selective to the semiconductive-behaving material 126 and not the dielectric 114 or the seed layer 124. This effectively removes the semiconductive-behaving material 126 for the top transistor structure, while the dielectric 114 and the seed layers 124 protect the other transistor layers from the selective etching process. As shown in the cross-sectional view 1002, this leaves a new gap between the core dielectric 114 and the layers of the top transistor structure. Although this stage in the process flow is shown as following from the process flow shown in FIG. 7, the processes described in connection with FIG. 10 may also be performed following the steps described in connection with FIG. 9, such that the directional etching process is stopped by the dielectric 114 that fills the gaps left by the removed seed layer 124, rather than the seed layer 124 itself.

FIG. 11 illustrates a top view 1100 and a cross-sectional view 1102 of a device at the next stage of the process flow, following the process flow described in connection with FIG. 10. As shown in the cross-sectional view 1102, a second semiconductive-behaving material 130 (e.g., P-type) may be deposited in the channel opening. The second semiconductive-behaving material 130 may be deposited using techniques similar to those used to deposit the semiconductive-behaving material 126. The second semiconductive-behaving material 130 can be a different semiconductive-behaving material than the semiconductive-behaving material 126. For example, the second semiconductive-behaving material 130 can be a P-type material, while the semiconductive-behaving material 126 can be an N-type material, or vice-versa.

FIGS. 12-17 depict an alternative configuration in which the semiconductive-behaving materials 126 are selectively deposited or grown on the transistor structures, rather than utilizing seed layers as depicted in the techniques in FIGS. 1-11. In the alternative configuration shown in FIG. 12, illustrated is a top view 1200 and a cross-sectional view 1202 of a device. This configuration includes a stack of layers similar to that shown in connection with FIG. 1. As shown, a substrate 104 is provided which may be active or passive and may comprise, dielectric, conductive or semiconductive materials or any combination thereof. As described above, one or more dielectric layers 106 may be provided on the substrate to isolate the VFET structure from the underlying substrate. The substrate 104 may remain in the final structure or may be removed during or after the formation of the VFET structure. As above, the first S/D layer 108 may be formed directly on the substrate or on the one or more dielectric layers 106 described above. An insulating dielectric 110 is formed on the first S/D layer. Upon that layer, a gate layer 112 is formed. An insulating layer 110 and then a second S/D layer 108 are formed on the gate layer 112, to complete a first transistor structure (e.g., a source, a gate, and a drain). Subsequent transistor structures may be stacked above the first transistor structure with one or more insulating dielectric layers 114 between adjacent transistor stacks. These layers may be formed without a mask such that each layer forms a blanket layer over the prior layer. Once the layers are formed, each VFET structure or vertical group of VFET structures may be patterned as is well understood in the art to separate adjacent transistor structure stacks isolated in the x-y plane.

As described above, at least three layers of dielectric may be utilized (e.g., oxide-nitride-oxide or nitride-oxide-nitride) to isolate adjacent transistors from each other. However, as shown in the cross-sectional view 1302, a single dielectric layer 114 (e.g., SiO or $Si_xN_y$) may be utilized and may, in certain embodiments, be formed to be thicker in the z-direction than the dielectric layers separating the gate layer 112 (or the gate layer 116) from the S/D layers 108. As will be further described below, this allows semiconductive-behaving oxide material to be formed selectively such as not to extend completely over the dielectric layers. This will prevent shorting or other undesirable outcomes in the final structure.

Figure 13:
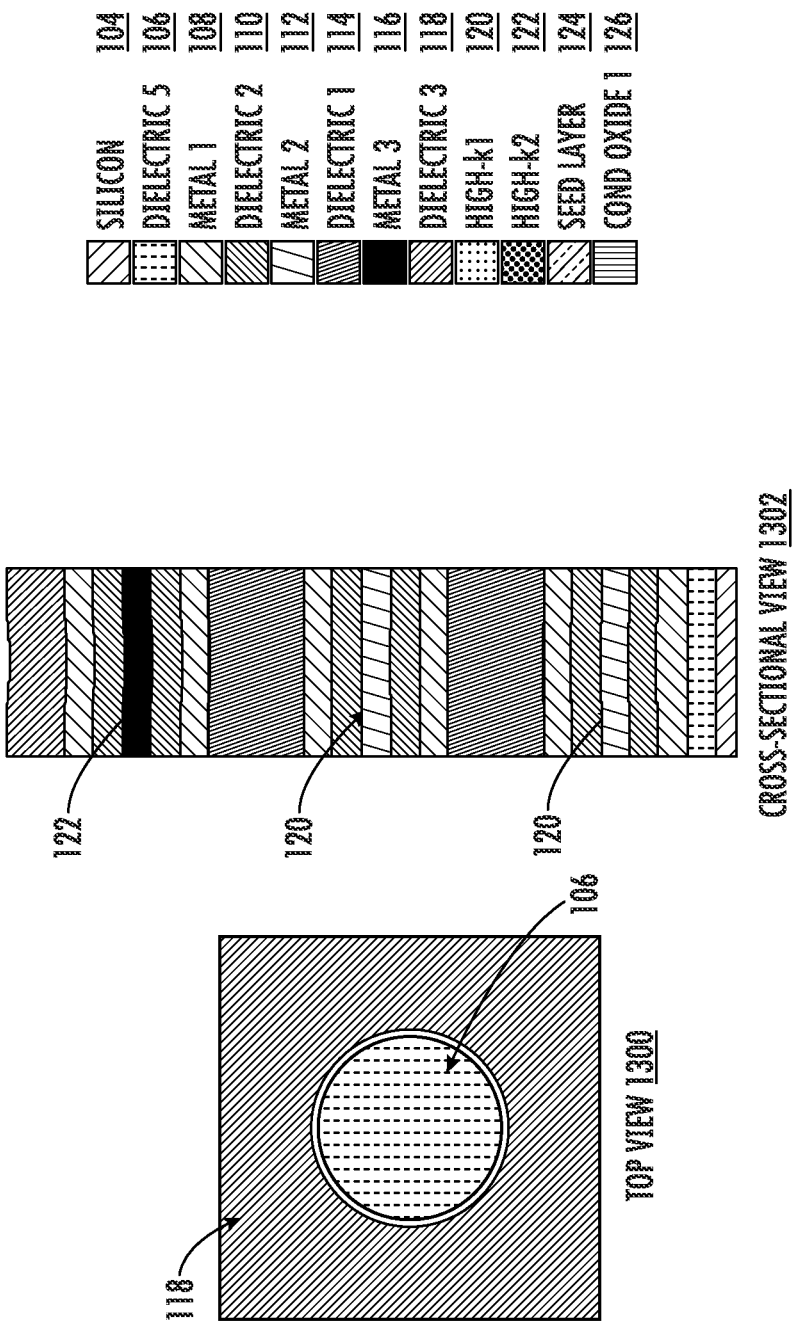

FIG. 13 illustrates a top view 1300 and a cross-sectional view 1302 of a device at the next stage of the process flow following that described in connection with FIG. 12. Either before or after patterning the structures, one or more channel openings may be formed. The process used to open the channel openings may be similar to the process described in connection with FIG. 2. To form the channel openings, a mask may be formed over the uppermost layer (in the z-direction) with openings that define the x-y cross-section of the channel openings. One or more etching techniques are performed to remove the portion of the underlying layers aligned with the opening in the mask. The mask may be removed once the channel openings are defined, or may be retained to protect the underlying surface or to remain as part of the final structure. Once the channel openings are defined, one or more of the gate layers 112 or the gate layers 116 may be etched slightly in the x-y direction to recess the gate from the channel. Then gate dielectric layers 120 and 122 may be deposited on their respective gate layers 112 and 116 as described in connection with FIGS. 3 and 4.

FIG. 14 illustrates a top view 1400 and a cross-sectional view 1402 of a device at the next stage in the process flow, in which semiconductive behaving material 126 is selectively deposited or grown on corresponding transistor structures. The semiconductive-behaving material 126 layer may be selectively formed, such that the material is deposited or grown on the S/D layers 108 and the dielectric layers 110 and 106, but does not grown on the dielectric layer 114, thereby electrically separating each of the transistor channels in the channel opening from one another.

The semiconductive-behaving material 126 layer may deposit or grow in multiple directions extending from the underlying transistor structure layers. As shown in the cross-sectional view 1402, the semiconductive-behaving material 126 may grow partially over the dielectric layer 114 that separates each of the layers. However, because the dielectric layers 114 are thicker than other layers in the stack, the portions of the semiconductive-behaving material 126 that correspond to each transistor structure are still separated by an air gap. Thus, it may be advantageous to have additional layers of dielectric (or a thicker dielectric, as shown) on either side of each transistor structure that either prevent or deter formation of the semiconductive-behaving material 126 layer thereupon. This may prevent adjacent transistor structures from coupling or shorting out during operation.

As described above, the semiconductive-behaving oxide material 126 may be one or more layers of a semiconductive oxide, conductive oxide or other material. Additionally, or alternatively, one or more of the channel materials may include an epitaxial grown or polycrystalline deposited semiconductor, such as Si, Ge, GaAs, etc. According to one example implementation, the isolation region between transistors is $SiO_2$ or $SiO_xN_y$. A conductive oxide will deposit continuously between the S/D in the channel regions of each transistor.

The semiconductive-behaving material 126 may be formed using certain elements that, when combined with oxygen, form a new material that exhibits semiconductive behavior, e.g., the material can be "turned off" with a low off state leakage current or can be "turned on" and become highly conductive when voltage is applied. Example materials to create an N-type channel include, but are not limited to, $In_2O_3$, $SnO_2$, InGaZnO, and ZnO. A P-type channel may be formed utilizing, for example, SnO. These materials may be further doped to improve their electrical characteristics. An etching technique may be utilized to remove excess material, such as any overgrowth on the isolation region.

The semiconductive-behaving material 126 may be formed to have an opening, thereby allowing the electrical characteristics of the channel region be defined based on the thickness of the remaining layer, forming a donut or ring-shaped channel cylinder that is defined on its outermost edge by the channel opening and, if applicable, the gate dielectric layers 120 or 122. As shown in this implementation, the semiconductive-behaving material 126 does not grow on the seed layer 124 (which may not be utilized in this process flow) and instead is deposited or grows on other layers, such as the S/D layer and gate dielectric 120 and 122. Optionally, one or more suitable etching techniques may then be utilized to define a core area in the semiconductive-behaving materials 126, as described herein, resulting in controlled channel regions with constant or varying cross-section in the z-direction.

FIG. 15 illustrates a top view 1500 and a cross-sectional view 1502 of a device at the next stage in the process flow, in which a dielectric material 114 is used to fill the gaps in the central opening after depositing or growing the semiconductive-behaving material 126. The core area may be deposit-filled with a dielectric material 114 such that it electrically isolates each of the regions of the semiconductive-behaving material 126 for each transistor structure from one another. Alternatively, some or all of the core area may be left empty to leave an air gap (not shown). If an air gap is desired, the core area may be sealed at an upper end using a capping material to prevent unwanted debris, liquid, moisture, or other material from entering the gap and potentially affecting the devices.

FIGS. 16 and 17 illustrates a top view 1600, 1700 and a cross-sectional view 1602, 1702 of a device. After the step shown in FIG. 15, the semiconductive-behaving material 126 may be etched (e.g., using techniques similar to those described in connection with FIGS. 10 and 11), and a different semiconductive-behaving material 130 may be deposited. For a multiple stacked VFET structure (e.g., a CFET stack), an additional semiconductive-behaving material 130 may be formed to create a second channel region with characteristics different than the underlying devices. The additional semiconductive-behaving material 130 may be the same material as the underlying semiconductive-behaving material 130, or it may be different, though the materials indicated above may be used. For example, utilizing different semiconductive-behaving type materials 130 than underlying devices may provide different types of devices (N-type/P-type or P-type/N-type, for example). Moreover, semiconductive oxides may be used for one channel structure and epitaxial or polycrystalline semiconductor materials may be used for another channel structure. The channel regions may each be formed and, in some cases, etched to different thicknesses to control the final channel depth for each device in the stack. The process may be repeated to provide an array of transistors in the x, y, and z directions.

The stack may be further processed (e.g., using patterning and etching techniques at various stages in the process flows described herein) to provide wiring to gates and S/D regions (not shown). The stack may be bonded to other structures to create electronic or electric circuits, such as other logic circuits, memory circuits, sensors, or other devices. The structures may also be connected to circuits and devices underlying the stack in the base substrate 104, if applicable. Connections may be formed between layers by forming vias and/or traces at appropriate stages in the process flow. This enables complex and dense logical circuits to be created in both the z-direction and the x-y directions.

FIG. 18 illustrates a flow diagram of a method 1800 for fabricating 3D semiconductor devices. The method 1800 may include steps 1805-1820. However, other embodiments may include additional or alternative steps, or may omit one or more steps altogether.

At step 1805, the method 1800 includes forming a stack of layers. The stack of layers may include one or more transistor structures. For example, the stack of layers may include a first layer stack including at least three layers of the at least one conductive material (e.g., the S/D metal layers 108 and the gate layers 112 or 116) separated by one or more layers of at least one dielectric material (e.g., the dielectric materials 106, 110, or 114). The first layer stack may be associated with a first transistor structure (e.g., two S/D layers 108 with a gate layer 112 or 116 positioned in-between). The stack of layers may be formed to include multiple transistors structures. For example, the stack of layers may include a second layer stack including at least three layers of at least one conductive material (e.g., the S/D metal layers 108 and the gate layers 112 or 116) separated by one or more layers of at least one dielectric material (e.g., the dielectric materials 106, 110, or 114). The second layer stack may be associated with a second transistor structure. Additional transistor structures may also be formed using similar techniques. The first and second transistor structures may be separated by one or more dielectric materials (e.g., the dielectric materials 114). The stack of layers may be formed using techniques similar to those described in connection with FIG. 1 or 12.

At step 1810, the method 1800 can include forming a channel opening in the stack. The channel opening (sometimes referred to as the "transistor body opening") may be formed using any type of suitable etching technique, similar to the techniques described in connection with FIGS. 2 and 13. The transistor body opening may extend through each of the transistor structures in the stack of layers. After defining the channel opening, high-k gate dielectrics (e.g., the gate dielectrics 120 or 122) may be deposited on the gate layers (e.g., the gate layers 112 or 116) in each transistor structure in the stack of layers. To do so, one or more of the gate layers may be recessed using techniques similar to those described in connection with FIG. 3, and the high-k gate dielectric materials may be subsequently deposited using techniques similar to those described in connection with FIG. 4 or 13. In addition, a seed layer (e.g., the seed layer 124) may be selectively deposited on the one or more dielectric materials (e.g., the dielectric materials 114) separating the transistor structures in the stack of layers. To do so, techniques similar to those described in connection with FIG. 5 may be performed. Alternatively, seed layers may not be formed, and semiconductive materials may instead be selectively grown or deposited in subsequent processing steps in the absence of a seed layer.

At step 1815, the method 1800 can include selectively forming a first channel structure within the channel opening. The first channel structure may include a deposited material (e.g., the deposited material 126). The first channel structure is aligned with the first transistor structure. The first channel structure may be deposited using techniques similar to those described in connection with FIG. 6 or 14. If the techniques described in connection with FIG. 6 are used, then the first channel structure may be formed selectively on areas other than the seed layer, such that the seed layer behaves as an isolating barrier between each of the transistor structures. If the techniques described in connection with FIG. 14 are used, the first channel structure may be formed in a manner that is de-selective to at least one of the one or more dielectric materials, while selectively grown or deposited on the materials that make up the transistor stack, such that air gaps separate the channel structures of each transistor structure, rather than a seed layer, as in FIG. 6. The semiconductive behaving material may be any type of semiconductive-behaving material and may be an N-type semiconductive oxide.

If a separate channel structure is desired (e.g., a different type of channel structure, etc.), at step 1820, the method 1800 may include selectively forming a second channel structure within the channel opening. The second channel structure may include a second semiconductive behaving oxide material (e.g., the semiconductive-behaving material 130). The second semiconductive behaving oxide material may be formed such that it is aligned with the second transistor structure in the stack of layers. The second channel structure may be deposited using techniques similar to those described in connection with FIGS. 10 and 11, 14, or 16 and 17. If the techniques described in connection with FIGS. 10 and 11 are used, then a core area may be defined using etching techniques and filled with a dielectric material (e.g., the dielectric material 114), and a top portion of the first channel structure may be removed (e.g., down to the seed layer). The second channel structure may then be deposited or grown in the gap left by removing the top portion of the first channel structure. The second channel structure may be formed selectively on areas other than the seed layer, such that the seed layer behaves as an isolating barrier between each of the transistor structures. If the techniques described in connection with FIG. 14 are used, the second channel structure may be formed in a manner that is de-selective to at least one of the one or more dielectric materials, while selectively grown on the materials that make up the transistor stack, such that air gaps separate the channel structures of each transistor structure.

If the techniques described in connection with FIGS. 16 and 17 are used, then a core area may be defined using etching techniques and filled with a dielectric material (e.g., the dielectric material 114), and a top portion of the first channel structure may be removed (e.g., down to the dielectric filling the air gap between the transistor structures, as shown in FIG. 16). The second channel structure may then be deposited or grown in the gap left by removing the top portion of the first channel structure. The semiconductive behaving material may be any type of semiconductive-behaving material and may be an N-type semiconductive oxide or a P-type semiconductive oxide material. The first channel structure and the second channel structure may include same material, or may include different materials (e.g., N-type/N-type, P-type/N-type, or N-type/P-type, among other combinations of additional transistor structures in the stack of layers). For example, if the second channel structure is different from the material used in the first channel structure, a CFET device may be formed. In some implementations, only a single VFET device layer may be formed, and step 1820 may be omitted from the process flow.

Having now described some illustrative implementations, it is apparent that the foregoing is illustrative and not limiting, having been presented by way of example. In particular, although many of the examples presented herein involve specific combinations of method acts or system elements, those acts and those elements may be combined in other ways to accomplish the same objectives. Acts, elements and features discussed only in connection with one implementation are not intended to be excluded from a similar role in other implementations or implementations.

The phraseology and terminology used herein is for the purpose of description and should not be regarded as limiting. The use of "including" "comprising" "having" "containing" "involving" "characterized by" "characterized in that" and variations thereof herein, is meant to encompass the items listed thereafter, equivalents thereof, and additional items, as well as alternate implementations consisting of the items listed thereafter exclusively. In one implementation, the systems and methods described herein consist of one, each combination of more than one, or all of the described elements, acts, or components.

"Substrate" or "target substrate" as used herein generically refers to an object being processed in accordance with the invention. The substrate may include any material portion or structure of a device, particularly a semiconductor or other electronics device, and may, for example, be a base substrate structure, such as a semiconductor wafer, reticle, or a layer on or overlying a base substrate structure such as a thin film. Thus, substrate is not limited to any particular base structure, underlying layer or overlying layer, patterned or un-patterned, but rather, is contemplated to include any such layer or base structure, and any combination of layers and/or base structures. The description may reference particular types of substrates, but this is for illustrative purposes only.

Any references to implementations or elements or acts of the systems and methods herein referred to in the singular may also embrace implementations including a plurality of these elements, and any references in plural to any implementation or element or act herein may also embrace implementations including only a single element. References in the singular or plural form are not intended to limit the presently disclosed systems or methods, their components, acts, or elements to single or plural configurations. References to any act or element being based on any information, act or element may include implementations where the act or element is based at least in part on any information, act, or element.

Any implementation disclosed herein may be combined with any other implementation, and references to "an implementation," "some implementations," "an alternate implementation," "various implementation," "one implementation" or the like are not necessarily mutually exclusive and are intended to indicate that a particular feature, structure, or characteristic described in connection with the implementation may be included in at least one implementation. Such terms as used herein are not necessarily all referring to the same implementation. Any implementation may be combined with any other implementation, inclusively or exclusively, in any manner consistent with the aspects and implementations disclosed herein.

References to "or" may be construed as inclusive so that any terms described using "or" may indicate any of a single, more than one, and all of the described terms.

Where technical features in the drawings, detailed description or any claim are followed by reference signs, the reference signs have been included for the sole purpose of increasing the intelligibility of the drawings, detailed description, and claims. Accordingly, neither the reference signs nor their absence have any limiting effect on the scope of any claim elements.

The preceding description of the disclosed embodiments is provided to enable any person skilled in the art to make or use the embodiments described herein and variations thereof. Various modifications to these embodiments will be readily apparent to those skilled in the art, and the principles defined herein may be applied to other embodiments without departing from the spirit or scope of the subject matter disclosed herein. Thus, the present disclosure is not intended to be limited to the embodiments shown herein but is to be accorded the widest scope consistent with the following claims and the principles and novel features disclosed herein.

While various aspects and embodiments have been disclosed, other aspects and embodiments are contemplated. The various aspects and embodiments disclosed are for purposes of illustration and are not intended to be limiting, with the true scope and spirit being indicated by the following claims.

What is claimed is:

1. A vertical field effect transistor (VFET) structure comprising:
   a stack of layers including:
      a first layer stack including at least three first layers of at least one conductive material extending in the x-y plane separated in the z plane by one or more first layers of at least one dielectric material, the first layer stack associated with a first transistor structure; and
      a second layer stack including at least three second layers of the at least one conductive material extending in the x-y plane separated in the z plane by one or more second layers of the at least one dielectric material, the second layer stack associated with a second transistor structure,
   the first and second transistor structures separated by one or more dielectric materials;
   a channel opening extending through the stack of layers along the z plane;
   a first channel structure within the channel opening, the first channel structure comprising a semiconductive behaving oxide material and coupled to the at least three first layers of the first layer stack, wherein the first channel structure surrounds an insulating layer in the channel opening; and
   a second channel structure within the channel opening, the second channel structure comprising a semiconductive behaving oxide material and coupled to the at least three second layers of the second layer stack, wherein the second channel structure surrounds the insulating layer in the channel opening and is separated apart from the first channel structure with the insulating layer.

2. The VFET structure of claim 1, wherein the first channel structure and the second channel structure comprise the same materials.

3. The VFET structure of claim 1, wherein the semiconductive behaving oxide of the first channel structure is an N-type semiconductive oxide, and wherein the semiconductive behaving oxide of the second channel structure is a P-type semiconductive oxide.

4. The VFET structure of claim 1, wherein each of the first layer stack and the second layer stack comprise at least one gate metal layer upon which a gate dielectric is deposited.

5. A complementary vertical field effect transistor (CFET) structure comprising:
   a stack of layers including:
      a first layer stack including at least first three layers of the at least one conductive material extending in the x-y plane separated in the z plane by one or more first layers of at least one dielectric material, the first layer stack associated with a first transistor structure; and
      a second layer stack including at least second three layers of at least one conductive material extending in the x-y plane separated in the z plane by one or more second layers of at least one dielectric material, the second layer stack associated with a second transistor structure,
   the first and second transistor structures separated by one or more dielectric materials;
   a channel opening extending through the stack of layers along the z plane;
   a first channel structure within the channel opening, the first channel structure comprising a semiconductive behaving oxide material and providing an N-type channel for the first transistor structure, wherein the first channel structure surrounds an insulating layer in the channel opening; and
   a second channel structure within the channel opening, the second channel structure comprising a semiconductive behaving oxide material and providing a P-type or N type channel for the second transistor structure, wherein the second channel structure surrounds the insulating layer in the channel opening and is separated apart from the first channel structure with the insulating layer.

6. The CFET structure of claim 5, wherein the first channel structure and the second channel structure comprise the same materials.

7. The CFET structure of claim 5, wherein the semiconductive behaving oxide of the first channel structure is an N-type semiconductive oxide, and wherein the semiconductive behaving oxide of the second channel structure is a P-type semiconductive oxide.

8. The CFET structure of claim 5, wherein each of the first layer stack and the second layer stack comprise at least one gate metal layer upon which a gate dielectric is deposited.

* * * * *